(12) United States Patent
Yang (10) Patent No.: US 8,213,228 B1
(45) Date of Patent: Jul. 3, 2012

(54) FLASH MEMORY READ PERFORMANCE

(75) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 332 days.

(21) Appl. No.: 12/610,106

(22) Filed: Oct. 30, 2009

Related U.S. Application Data (60) Provisional application No. 61/112,068, filed on Nov. 6, 2008.

(51) Int. Cl.
*G11C 11/34* (2006.01)
*G11C 16/04* (2006.01)
*G11C 16/06* (2006.01)

(52) U.S. Cl. ........... 365/185.03; 365/185.2; 365/185.22; 365/185.24; 365/185.29

(58) Field of Classification Search ............. 365/185.03, 365/185.2, 185.22, 185.24, 185.29
See application file for complete search history.

(56) References Cited

U.S. PATENT DOCUMENTS

| | | | |
|---|---|---|---|
| 5,864,504 A | 1/1999 | Tanzawa et al. | |
| 6,016,273 A * | 1/2000 | Seki et al. | 365/185.22 |
| 7,075,827 B2 | 7/2006 | Aoyama et al. | |
| 7,313,019 B2 | 12/2007 | Giduturi et al. | |
| 7,467,253 B2 * | 12/2008 | Yero | 711/103 |
| 7,542,350 B2 | 6/2009 | Park et al. | |
| 7,903,462 B1 * | 3/2011 | Yeung et al. | 365/185.17 |
| 2010/0027350 A1 * | 2/2010 | Melik-Martirosian et al. | 365/185.22 |

OTHER PUBLICATIONS

"Notice of Allowance", U.S. Appl. No. 12/762,150, (Mar. 19, 2012), 6 pages.

* cited by examiner

*Primary Examiner* — Ly D Pham (57) ABSTRACT

This disclosure describes techniques for reducing the number of data transmissions required to read an amount of data from multi-level-cell (MLC) flash memory. These techniques effectively increase the speed at which MLC flash memory can be read. This disclosure also describes techniques for determining whether or not a flash-memory cell has a high probability of an error by determining whether a voltage threshold is in close proximity to a reference voltage.

21 Claims, 8 Drawing Sheets

FLASH MEMORY READ PERFORMANCE

RELATED APPLICATION

This application claims priority to U.S. Provisional Patent Application Ser. No. 61/112,068 filed Nov. 6, 2008, the disclosure of which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Conventional flash memory stores data by storing electric charges. Each flash cell in the flash memory can store an electric charge. The amount of electric charge stored sets a voltage threshold. Each voltage threshold corresponds to a data value. Thus, a flash cell stores data by storing an electric charge.

Conventional flash memory is often configured to have either single-level cells or multi-level cells. Single-level-cell (SLC) flash memory uses a single reference voltage in the middle of a possible range of voltage thresholds to read stored data. Conventional flash memory logic determines data values by applying a reference voltage to cells of the single-level-cell flash memory. If the applied reference voltage is greater than the voltage threshold, then the cell conducts. If the applied reference voltage is lower than the voltage threshold, then the cell does not conduct. Based on whether the cell conducts or does not conduct, the flash memory logic determines that the single-level-cell stores a 0 or a 1. In other words, the reference voltage divides the possible range of voltage thresholds into two data regions, a data region for 0 and another for 1. Applying the reference voltage produces a resulting bit, which indicates the corresponding data region the voltage threshold is set in. This in turn determines whether data of a 0 or 1 is stored in the single-level-cell.

In multi-level-cell (MLC) flash memory, multiple reference voltages are used to divide the possible range of voltage thresholds into more than two data regions. Conventional two-bits/cell or four-level flash memory, for example, uses three reference voltages to divide the possible range of voltage thresholds into four data regions. This permits storage of two bits of information (e.g., possible binary values of 00, 01, 10, and 11). Conventional three-bits/cell or eight-level flash memory uses seven reference voltages to divide the possible range of voltage thresholds into eight data regions, which permits storage of three bits of information (e.g., possible binary values of 000, 001, 010, 011, 100, 101, 110, and 111).

Conventional flash memory logic reads data from a multi-level cell by applying each of the numerous reference voltages one at a time. After each reference voltage is applied, this logic stores the result, such as a 0 or a 1, in a page buffer. This page buffer conventionally stores results from multiple cells at once, which are then transferred to an external buffer associated with a flash controller. This is repeated until all the reference voltages have been applied.

For two-bits/cell MLC flash-memory, for example, conventional flash memory logic applies three reference voltages to read out all two bits. For three-bits/cell MLC flash-memory, this logic applies seven reference voltages to read out all three bits stored in the cell. For each application of a reference voltage, the set of results is stored in the page buffer and then transferred to the external buffer. After all three or seven sets of results have been transferred, the flash controller determines the data value of each cell based upon the three or seven sets of transmitted results in the external buffer.

The transfer of these sets of results to the external buffer, however, can make reading flash memory slow. In many cases, this transfer is the performance bottleneck for reading flash memory. For example, transmitting data from the page buffer to the external buffer is slow because the transfer is sequentially performed with only a few bits of data in each transmission.

SUMMARY

This summary is provided to introduce subject matter that is further described below in the Detailed Description and Drawings. Accordingly, this Summary should not be considered to describe essential features nor used to limit the scope of the claimed subject matter.

In one embodiment, a method is described that comprises receiving a first number (n) of data bits from a buffer, the data bits determined from a flash-memory cell and determining a data value stored within the flash-memory cell, the data value determined from the data bits, the data value having a second number (b) of bits, the first number (n) being less than $2^b-1$.

In another embodiment, a method is described that comprises applying two or more reference voltages to a multi-level-cell (MLC) flash-memory cell to determine two or more reference bits, determining a data bit based on the two or more reference bits, and communicating the data bit to a flash controller.

In still another embodiment, a method is described that comprises determining whether a voltage threshold of a flash-memory cell is or is not within an erase region of a first reference voltage, the erase region defined by a second reference voltage and a third reference voltage, the second reference voltage lower than the first reference voltage and the third reference voltage higher than the first reference voltage, the first reference voltage defining a border between two data bit regions, each data bit region associated with a data bit, and communicating a bit to a flash controller, the bit indicating whether or not the voltage threshold is or is not in the erase region.

BRIEF DESCRIPTION OF THE DRAWINGS

The detailed description is described with reference to the accompanying figures. In the figures, the left-most digit of a reference number identifies the figure in which the reference number first appears. The use of the same reference numbers in different instances in the description and the figures indicate similar or identical items.

DETAILED DESCRIPTION

As noted in the Background above, the performance of conventional flash memory is often limited by the number of data transmissions used to read the flash memory. This disclosure describes techniques for reducing the number of data transmissions required to read an amount of data. These techniques effectively increase the speed at which MLC flash memory can be read.

This disclosure also describes techniques for determining whether a voltage threshold is in close proximity to a first reference voltage, thereby indicating that a flash-memory cell may have an error. These techniques use two additional reference voltages that define an erase region surrounding the first reference voltage. These two sets of techniques may be used together or separately. When used together, the techniques reduce the number of data transmissions while permitting use of an erase region, which is useful for error correction decoders that accommodate erasure decoding or soft decoding. The technique can be applied to SLC flash memory in addition to MLC flash memory.

In the discussion that follows, an operating environment is described. Methods are also described that may be employed in the operating environment as well as other environments. In the discussion below, reference will be made to the environment by way of example only and, therefore, implementations described below are not limited to the environment.

Operating Environment

Figure 1:
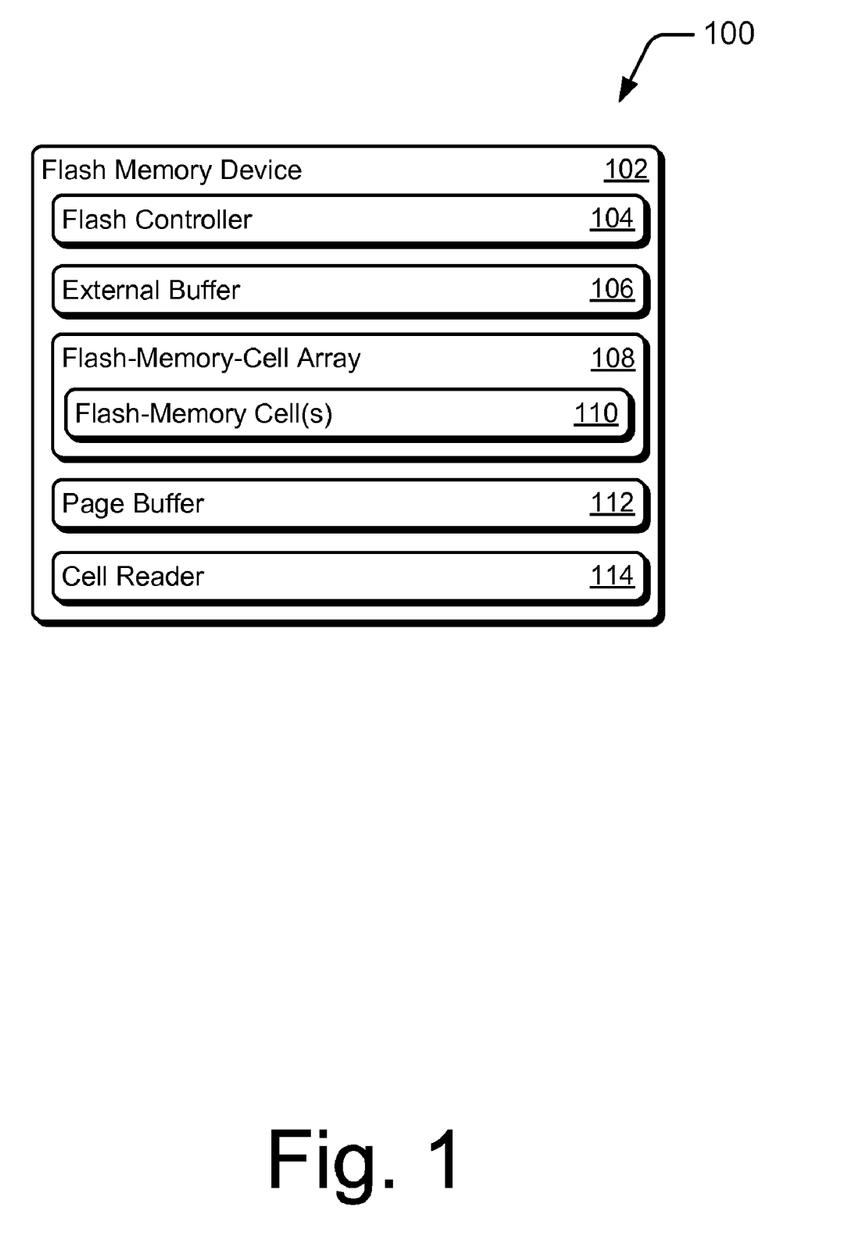
FIG. 1 illustrates an example operating environment.

FIG. 1 illustrates an operating environment 100 having a flash-memory device 102 in an embodiment of the invention. Flash-memory device 102 includes a flash controller 104, an external buffer 106, a flash-memory-cell array 108 including flash-memory cells 110, a page buffer 112, and a cell reader 114.

Flash controller 104 controls the operation of and data communications for flash-memory device 102. External buffer 106 is communicatively coupled to flash controller 104 from which it receives data directed from page buffer 112. Flash-memory-cell array 108 contains flash-memory cells 110, each cell having single or multiple levels. Each cell of flash-memory cells 110 stores one or multiple bits of information by storing an amount of charge effective to set a voltage threshold.

Page buffer 112 stores information some or all of which is later transferred to external buffer 106. Page buffer 112 receives information from reads of cells 110 in flash-memory-cell array 108. By way of example, consider a flash-memory-cell array having one or more pages, each page comprised of 16,384 flash-memory cells. A page buffer sufficient to store read results from these cells would have a two kilo-byte (KB) capacity to store the results of these cells simultaneously. All 16,384 flash-memory cells are read in parallel. Cell reader 114 is configured to read cells 110 by applying reference voltages to flash-memory cells 110, thereby approximately determining each cell's voltage threshold.

These elements of flash memory device 102 operate to read and provide data. By way of example, assume that flash controller 104 receives a request from a host to read data. Responsive to this request, flash controller 104 requests the data from cell reader 114. Cell reader 114 then fills page buffer 112 with data read from a page of cells 110, which are then transferred to external buffer 106. Flash controller 104 can then access the data from external buffer 106 and provide corresponding data values to the host. Various techniques for reading flash-memory cells, some of which use these elements of environment 100 are set forth in detail below. Other techniques are also possible.

Flash Memory Cell

Figure 2:
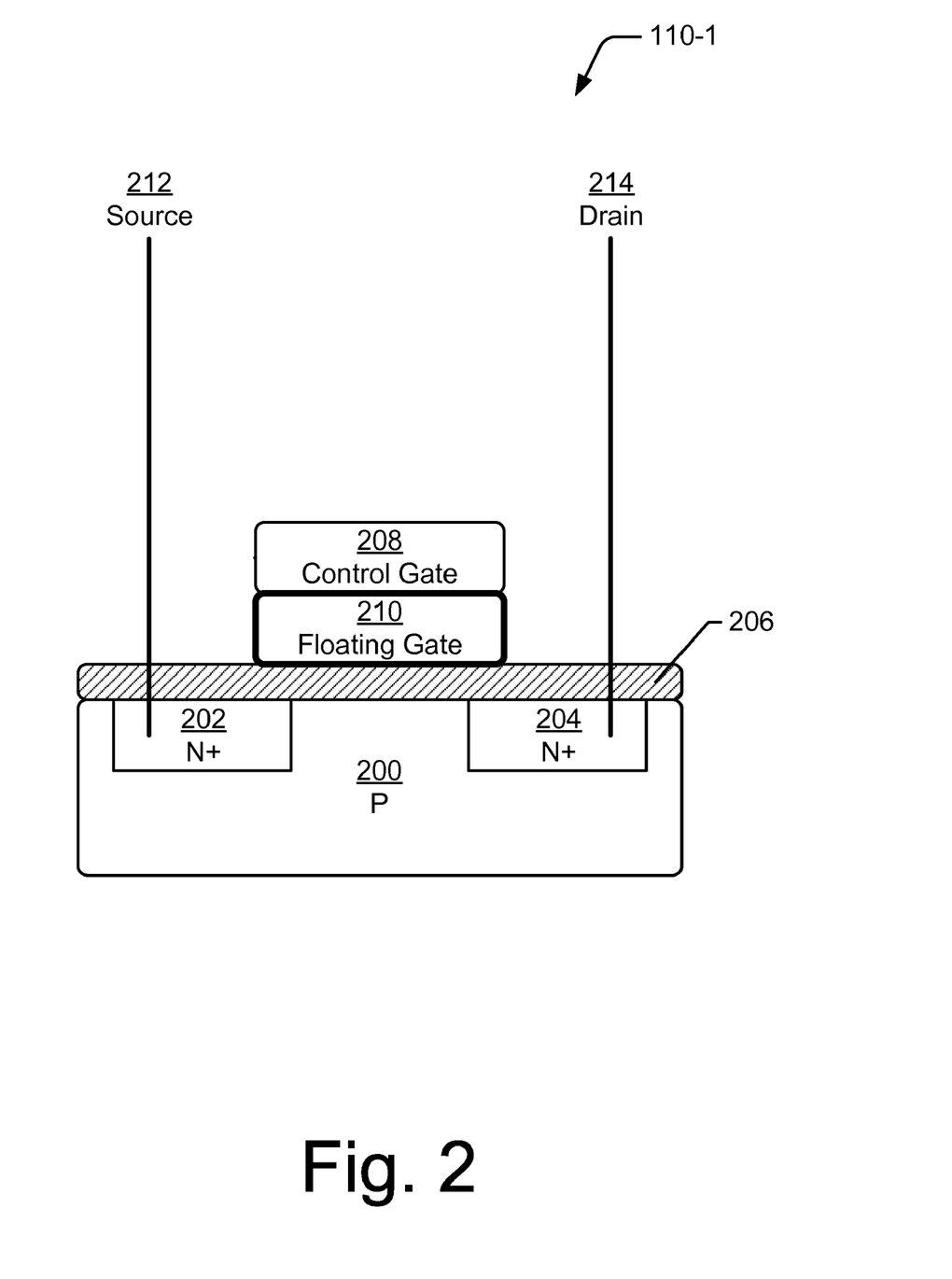
FIG. 2 illustrates an example of a single flash-memory cell.

FIG. 2 illustrates a single flash-memory cell 110-1. Flash-memory cell 110-1 is similar to a standard metal-oxide-silicon field-effect transistor (MOSFET). The MOSFET type shown is an N-channel MOSFET in that the body 200 is a "P" region and the source 202 and drain 204 regions are "N+" regions. A layer of insulating silicon dioxide ($SiO_2$) 206 insulates control gate 208 and floating gate 210 from body 200. A standard MOSFET does not have floating gate 210. In a standard MOSFET, when a voltage is applied to control gate 208 that is higher than a fixed voltage threshold, an electric field is created. This electric field causes electrons from source region 202 supplied by source line 212 to flow into body 200 where it interfaces with oxide 206. This creates an N-channel (not shown) between source region 202 and drain region 204. Current can pass through the N-channel between source line 212 and drain line 214.

A flash-memory cell 110-1 differs from a standard MOSFET in that it has floating gate 210. Floating gate 210 is oriented between control gate 208 and oxide 206. Floating gate 210 is insulated by a layer of $SiO_2$ all around it (illustrated by the darker border). This allows a charge to be stored in floating gate 210 and remain there for extended periods. This charge partially cancels the electric field from control gate 208, which in turn modifies the voltage threshold of the cell 110-1. By varying the charge stored in floating gate 210, the voltage threshold of the cell can be varied.

When storing data in a flash cell, the voltage threshold is set for the cell to a pre-determined amount associated with a particular bit or bits of data. The voltage threshold is set by placing a charge in floating gate 210. When reading a flash-memory cell 110-1, a reference voltage is applied to control gate 208. Current flowing between source line 212 and drain line 214 is detected (or its absence detected). By detecting this current, it is known whether or not the reference voltage applied to control gate 208 is higher or lower than the voltage threshold. By so doing, it can be determined approximately at which level the voltage threshold is at, which in turn determines what bit or bits are stored in cell 110-1.

Figure 3:
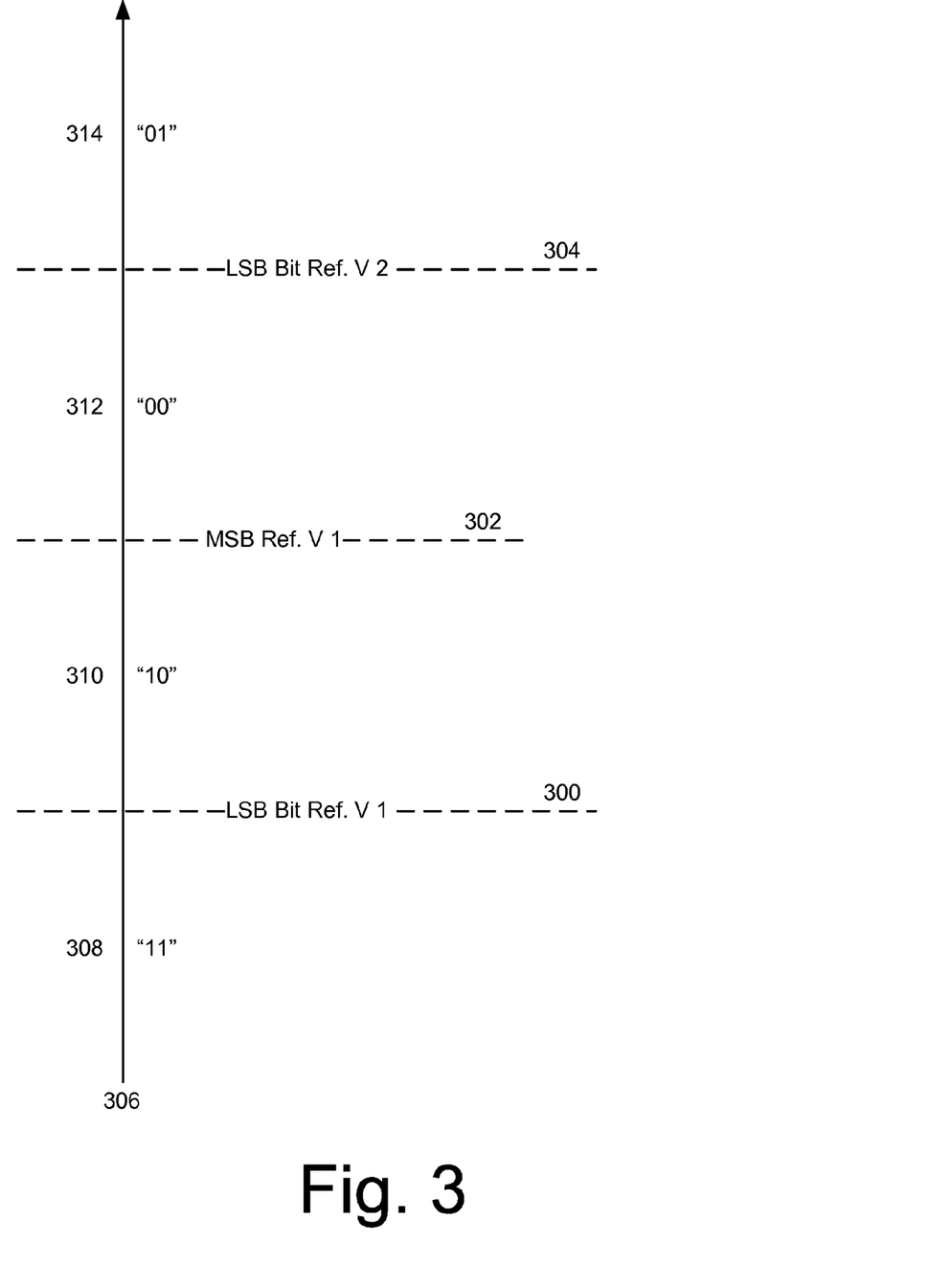
FIG. 3 illustrates the reference voltages of a two-level MLC flash-memory cell.

FIG. 3 illustrates the reference voltages of a two-bits/cell MLC flash-memory cell. A two-bits/cell flash cell stores two bits of data and utilizes three different reference voltages (300, 302, and 304) to read those bits. The variable voltage threshold of cell 110-1 is illustrated by arrowed line 306. For simplicity assume that a minimum voltage threshold is 1 volt and a maximum voltage threshold is 2 volts (at the bottom and top of the page, respectively). Reference voltage 300 is approximately 1.25 volts, reference voltage 302 is approximately 1.5 volts, and reference voltage 304 is approximately 1.75 volts. When data is stored in the cell, the voltage threshold will be set to one of four voltage thresholds. For two bits of data, there are four data regions 308, 310, 312, and 314. Data region 308 is represented by voltage thresholds from 1 volt to just under 1.25 volts but is typically set at approximately 1.125 volts. Data region 310 is represented by voltage thresholds from 1.25 volts to just under 1.5 volts but is typically set at approximately 1.375 volts. Data region 312 is represented by voltage thresholds from 1.5 volts to just under 1.75 volts but is typically set at approximately 1.625 volts. Data region 314 is represented by voltage thresholds from 1.75 volts to 2 volts but is typically set at approximately 1.875 volts.

In conventional two-level flash-memory cells, a read operation consists of applying one of the three reference voltages (300, 302, and 304) to control gate 208. Whether or not current is flowing between source line 212 and drain line 214 is determined. If current is flowing because the applied reference voltage is higher than the set threshold voltage, then a 1 is output as a reference bit and stored in page buffer 112. If no current is flowing, then a 0 is output as the reference bit and stored in page buffer 112. This reference bit is transferred to external buffer 106 for receipt by flash controller 104. This process is repeated for the other two reference bits. Flash controller 104 then determines in which data area the voltage threshold is set and thus which corresponding bits are stored in the cell. For one read operation, three reference bits are determined and transmitted to flash controller 104.

Techniques described herein reduce the number of bits transmitted, thereby speeding up data reads from flash memory. In FIG. 3, a particular order of association of two-bit data values enables a reduction in the number of data transfers to flash controller 104. For the two-bit cell of FIG. 3, the bits are assigned as follows: bits "11" are assigned to data region 308; "10" to data region 310; "00" to data region 312; and "01" to data region 314. The most-significant bit (MSB) is the $2^1$ place of the above two-bit data values. The least-significant bit (LSB) is the $2^0$ place of the above two-bit data values. Notice that the most-significant bit (MSB) is divided into two main data-bit regions by reference voltage 302. For example, a most-significant bit of 1 is associated with data regions 308 and 310, which together make up a data-bit region for a most-significant bit of 1. A most-significant bit of 0 is associated with data regions 312 and 314, which together make up a data-bit region for a most-significant bit of 0. By associated it is meant that, in order to store a most-significant bit of 1 or 0, the voltage threshold of the cell is set to a voltage threshold within the associated data-bit region. This allows for the most-significant bit to be determined by applying a single reference voltage. Reference voltage 302 (MSB Ref V 1) is applied and the resulting reference bit of 1 or 0 is the data bit for the most-significant bit of the data value stored in the cell. This reference bit is transferred to flash controller 104.

The least-significant bit (LSB) is divided into three main data-bit regions determined as follows. A least-significant bit of 1 is associated with data regions 308 and 314, each of which is a separate data-bit region for a least-significant bit of 1. A least-significant bit of 0 is associated with data regions 310 and 312, which together make up a data-bit region for a least-significant bit of 0. This allows for the least-significant bit to be determined by applying two reference voltages. Reference voltage 300 (LSB Ref V 1) is applied and the resulting reference bit of 1 or 0 is stored in page buffer 112. Reference voltage 304 (LSB Bit Ref V 2) is applied and the resulting reference bit of 1 or 0 is subjected to an exclusive-OR (XOR) operation with the previous reference bit residing in page buffer 112. The result is then inverted and stored in page buffer 112. This result of the XOR operation and inversion is the data bit for the least-significant bit of the data value stored in the cell. This data bit is transferred to flash controller 104. Alternatively an exclusive-NOR (XNOR) operation is performed on the reference bits and no inversion is necessary. Thus, for one read operation, three reference bits are determined, but only two bits are transmitted to flash controller 104.

This reduction in data transfers becomes even more important when more levels are added. For example, in three-bits/cell flash memory, one read operation involves seven reference bits being determined but only three bits being transmitted to flash controller 104. A simple formula shows the contrast between conventional flash memory and these new techniques. In conventional techniques, $2^b-1$ data transfers are performed where b is the number of bits in the data value stored in the cell. Thus, with a three-level cell (b=3), conventional techniques use a number of data transfers=$2^3-1=7$. The techniques described herein enable as few as b data transfers (b=3). Likewise, for a four-bits/cell flash cell, the number of data transfers for a conventional techniques is =$2^4-1=15$. The techniques described herein permit as few as four data transfers (b=4).

Another issue with flash-memory cells is that sometimes they are defective, such as when a charge stored in floating gate 210 dissipates unintentionally. This causes the voltage threshold of the cell to float, permitting one or more bits of the data value to change (e.g., flip).

Flash Memory Cell Enabling a Confidence Bit

Figure 4:
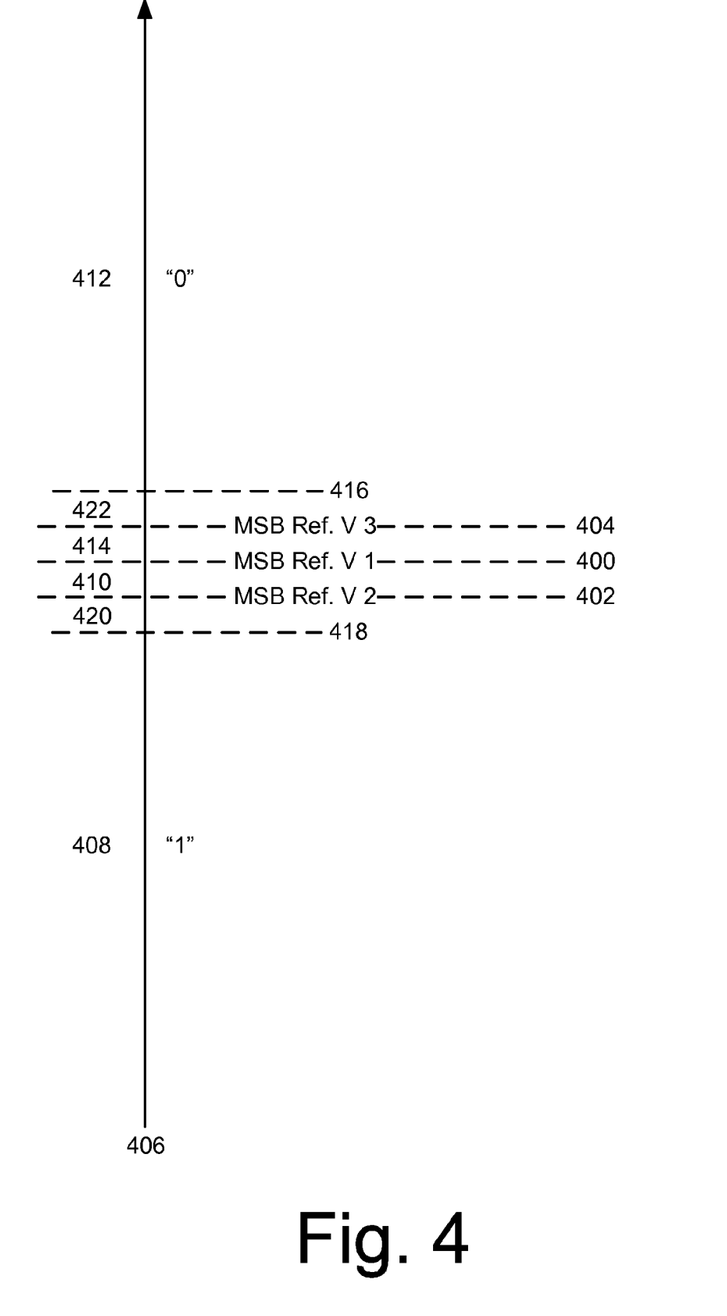
FIG. 4 illustrates the reference voltages of a single-level-cell (SLC) flash-memory cell.

Consider FIG. 4, which illustrates reference voltages of a single-level-cell (SLC) flash-memory cell. A single-level-cell flash-memory cell stores one bit of data as its data value. Thus, one reference voltage 400 is used to determine the cell's stored data value. In order to determine if a cell's voltage threshold is floating, however, an erase region is defined around reference voltage 400. This erase region includes voltage thresholds at or above reference voltage 402 and below reference voltage 404. A single-level-cell is used as an example, though multi-level-cells may also be used.

Assume that the range of possible voltage thresholds 406 has a minimum of 1 volt and a maximum of 2 volts. Reference voltage 400 is approximately 1.5 volts, reference voltage 402 is approximately 1.4 volts, and reference voltage 404 is approximately 1.6 volts. When data is stored in the cell, the voltage threshold will be set to a voltage threshold within one of two data regions. A data bit of "1" is associated with a first data region, which includes regions 408 and 410. This first data region is represented by voltage thresholds from 1 volt to just under 1.5 volts. Typically a data bit of "1" will be stored by setting the voltage threshold to approximately 1.25 volts. A data bit of "0" is associated with a second data region, which includes regions 412 and 414. This second data region is represented by voltage thresholds from 1.5 volts to 2 volts. A data bit of "0" will typically be stored by setting a voltage threshold of approximately 1.75 volts. The erase region including regions 410 and 414 is represented by voltage thresholds from 1.4 volts to just under 1.6 volts.

If the voltage threshold is within the erase region, the cell is more likely to be defective and its data value in error. To determine if the voltage threshold is within the erase region, reference voltage 402 (MSB Ref V 2) is applied and the resulting reference bit of 1 or 0 is stored in page buffer 112. Reference voltage 404 (MSB Ref V 3) is applied and the resulting reference bit of 1 or 0 is subjected to an XOR operation with the previous reference bit residing in page buffer 112. The resulting bit is stored in page buffer 112 as a confidence bit. A confidence bit of 1 indicates that the voltage threshold is within the erase region for its associated data bit. In this case, there is only one confidence bit, but in some MLC memory there is a confidence bit for each data bit. This confidence bit is transferred to flash controller 104. Note that the result of the XOR operation is not inverted as when determining the least-significant bit for the two-level cell example. Thus, by using a similar technique, an extra confidence bit is added by using two additional reference voltages but only one extra data transfer is performed.

The confidence bit provides better read-out resolution and can be used efficiently by an appropriate error correction code decoder for improved error recovery. A data bit and its corresponding confidence bit together make up a quantized value that can be translated into a real value output or a log-likelihood ratio (LLR) value. The table below shows the possible real value or LLR value output for the four possible quantized values. The LLR value output is assuming a noise variance of $\sigma^2$. In other words, the LLR value models the uncertainty or deviation of the actual threshold voltage of a cell from its nominal threshold voltage by an additive Gaussian noise model. The variance of the Gaussian noise is given by $\sigma^2$.

TABLE I

|  | Data Bit | | | |
| --- | --- | --- | --- | --- |
|  | 1 | 1 | 0 | 0 |
| Confidence Bit | 0 | 1 | 1 | 0 |
| Real Value Output | −1 | −0.2 | 0.2 | 1 |
| LLR value output | $-2/\sigma^2$ | $-0.2/\sigma^2$ | $0.2/\sigma^2$ | $2/\sigma^2$ |

If more read-out resolution is desired, one or more additional erase regions can be added. For example, adding one more reference voltage both above (at 416) and below (at 418) the erase region in the example above (hereinafter the inner erase region) will define an outer erase region. This outer erase region includes regions 410, 414, 420, and 422. Adding additional erase regions in turn will allow for confidence bits associated with different levels of confidence. If the voltage threshold is within the outer erase region, the cell is more likely to be defective than if the voltage threshold is not within either erase region. If the voltage threshold is within the outer erase region but not within the inner erase region, however, the cell is less likely to be defective than if the voltage threshold is within the inner erase region. If the voltage threshold is within inner erase region, however, the cell is most likely to be defective.

Note that one or more of the entities (e.g., flash controller 104, external buffer 106, page buffer 112, and cell reader 114) shown in FIG. 1 may be further divided, combined, and so on. These entities illustrate some of many possibilities (alone or combined) that are capable of employing the described techniques.

Methods for Reading Flash Memory Cells

This disclosure describes techniques for reading flash memory with fewer data transmissions, thereby improving read performance. These techniques may include at least the three methods illustrated below, which may be used separately or in combination(s). Aspects of these methods may be implemented in hardware, firmware, software, or a combination thereof. The methods are shown as a set of acts that specify operations performed by one or more entities and are not necessarily limited to the order shown.

Figure 5:
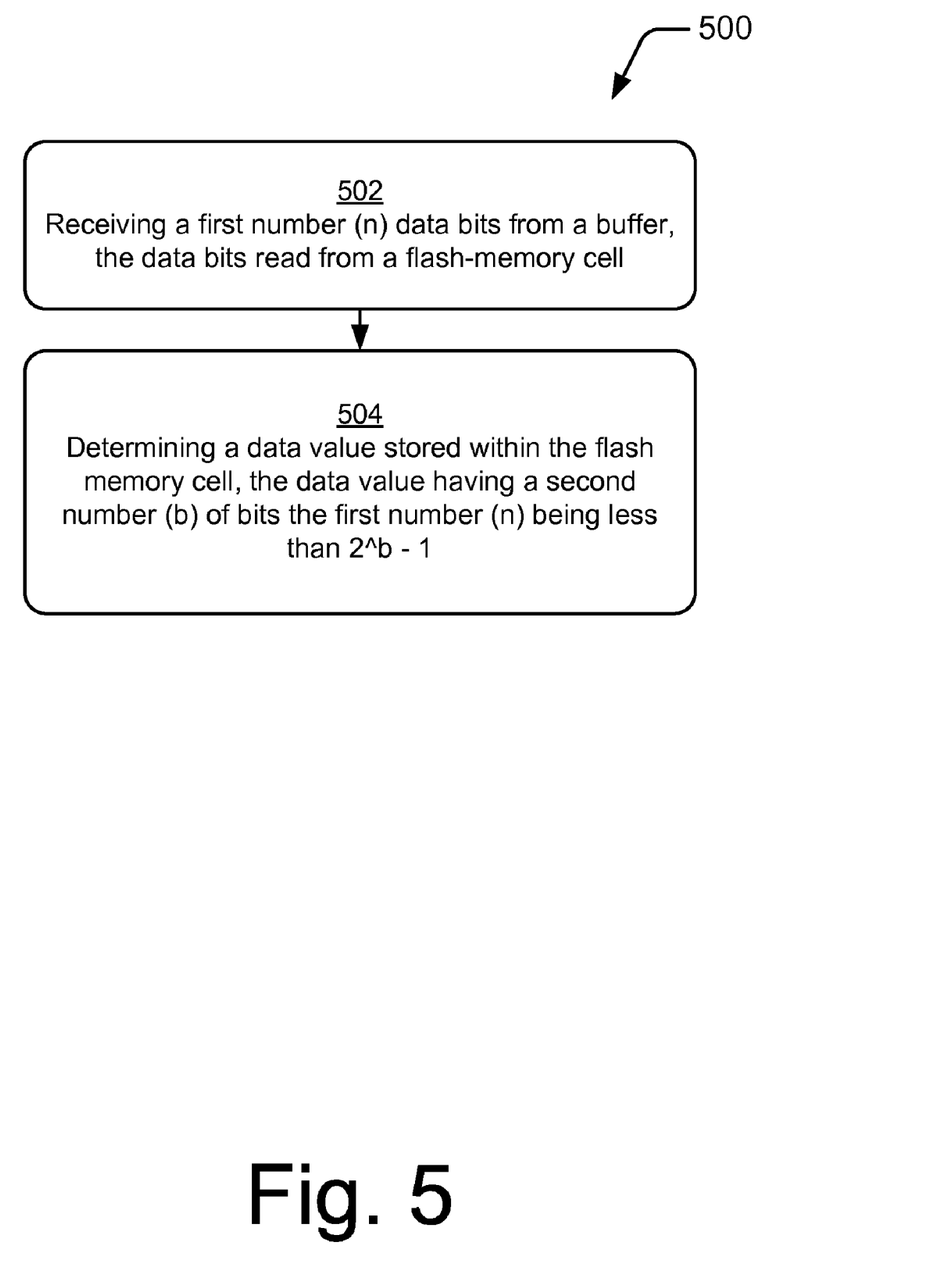
FIG. 5 illustrates a method for reading a data value stored in a flash-memory cell with fewer data transmissions in accordance with an embodiment of the present invention.

FIG. 5 illustrates a method 500 for reading a data value stored in an MLC flash-memory cell. At 502, a first number (n) of data bits are received from a buffer. The data bits were read from a flash-memory cell. At 504, a data value stored within the flash-memory cell is determined using the data bits received at 502. This data value is comprised of a second number (b) of bits. The first number (n) of data bits communicated at 502 is less than $2^b-1$ bits. Data value associations are arranged to enable simple logic to determine a particular data bit, such as without requiring transmission of each reference bit to the flash controller. This allows for fewer bits to be transferred, which improves read performance of flash-memory cells. For example, for a two-bits/cell MLC flash-memory cell less than three bits are transferred. For a three-bits/cell MLC flash-memory cell less than seven bits are transferred. For a four-bits/cell MLC flash-memory cell less than fifteen bits are transferred. For an eight-bits/cell MLC flash-memory cell less than 255 bits are transferred. Other arrangements are also possible, consistent with the principles of the invention.

Figure 6:
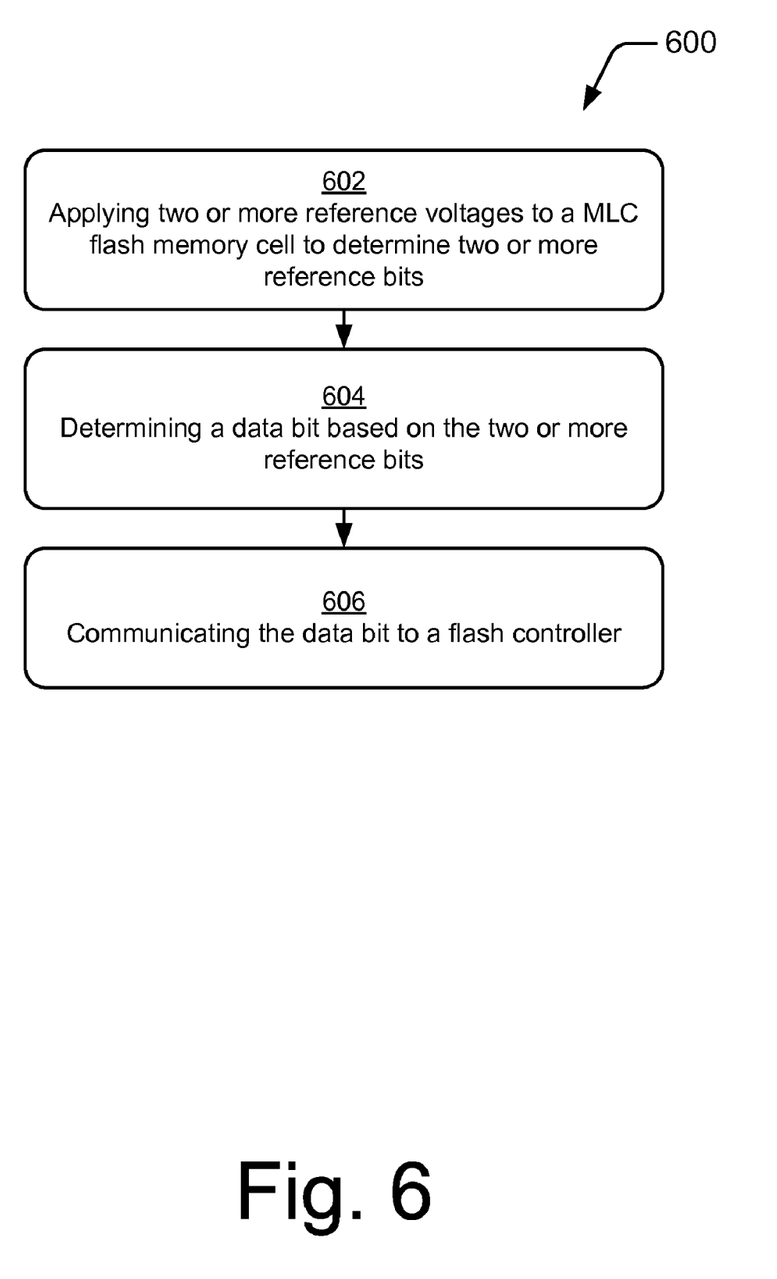
FIG. 6 illustrates another method for reading a data value stored in a flash-memory cell with fewer data transmissions in accordance with an embodiment of the present invention.

FIG. 6 illustrates an alternative method 600 for reading a data value stored in an MLC flash-memory cell. At 602, two or more reference voltages are applied to the multi-level cell to determine two or more reference bits. At 604, a data bit is determined based on the two or more reference bits. One way of determining the data bit is to perform one or more XOR operations on the two or more reference bits. The result of the one or more XOR operations is then inverted to create the data bit. At 606, the data bit is communicated to a flash controller.

Figure 7:
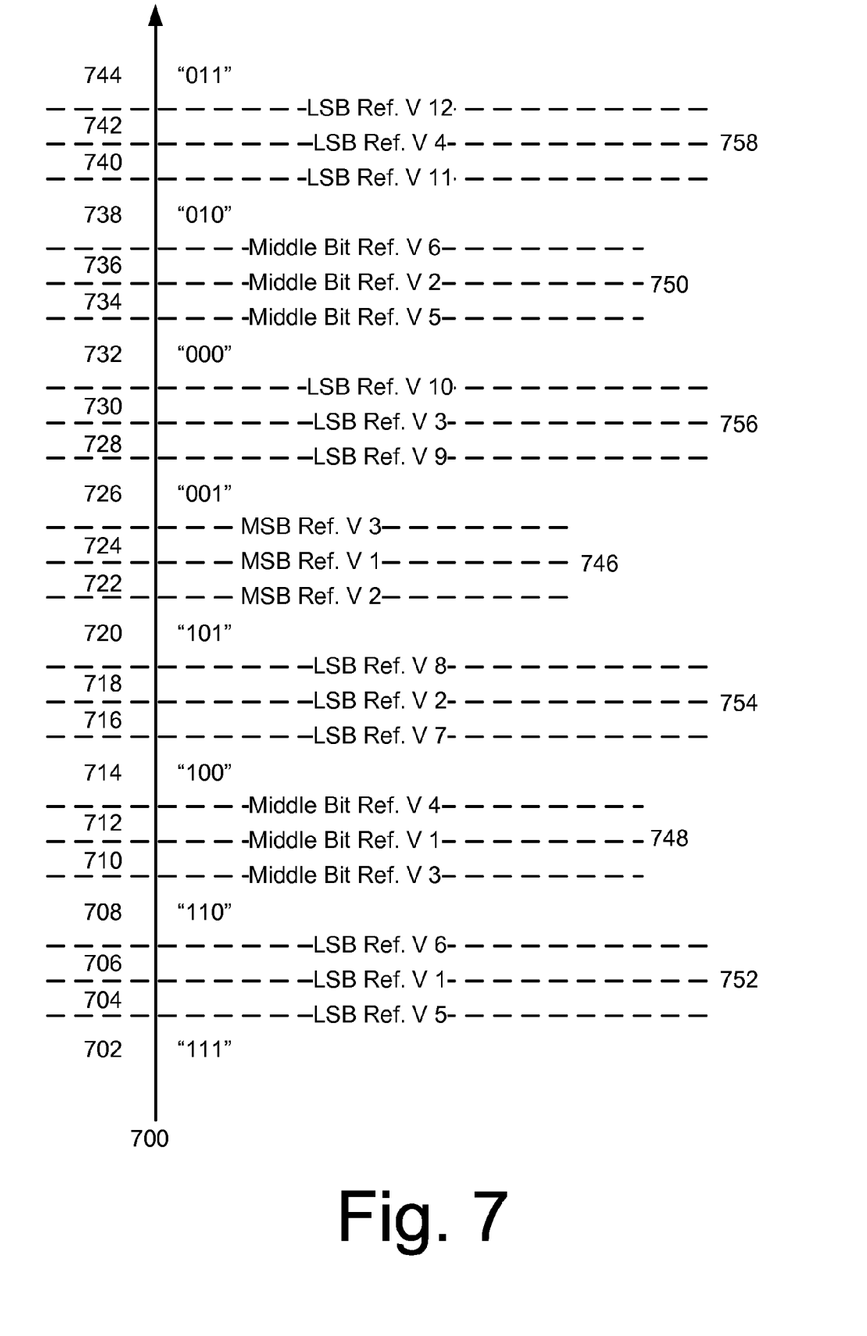
FIG. 7 illustrates the reference voltages of a three-level MLC flash-memory cell.

By way of example consider application of methods 500 and/or 600 to a three-bits/cell flash cell illustrated in FIG. 7. The range of possible voltage thresholds is indicated by arrowed line 700. Regions 702-744 are defined by different reference voltages (RefV). The binary values in quotes (e.g., "111", "110" . . . "011") represent data values possibly stored in the cell. A most-significant-bit ($2^2$ place) of 1 is associated with a data-bit region comprised of voltage thresholds within regions 702-722. A most-significant bit of 0 is associated with a data-bit region comprised of voltage thresholds within regions 724-744. Thus the most-significant bit of the data value stored in the cell is determined by applying reference voltage 746 (MSB Ref V 1). The resulting reference bit is a 0 if the cell does not conduct because reference voltage 746 is lower than the set threshold voltage of the cell (e.g., the voltage threshold is within regions 724-744). The resulting reference bit is a 1 if the cell conducts because reference voltage 746 is higher than the set threshold voltage of the cell (e.g., the voltage threshold is within regions 702-722). The resulting reference bit is placed in page buffer 112. For the most-significant bit, the reference bit is the data bit, which is transferred to external buffer 106 for use by flash controller 104.

A middle bit ($2^1$ place) of 1 is associated with two data-bit regions. The first data-bit region associated with a middle bit of 1 is comprised of voltage thresholds within regions 702-710. The second data-bit region associated with a middle bit of 1 is comprised of voltage thresholds within regions 736-744. A middle bit of 0 is associated with a data-bit region comprised of voltage thresholds within regions 712-734. To determine the middle bit of the data value stored in the cell, two reference voltages 748 and 750 (Middle Bit Ref V 1 and 2) are applied as in 602 above. The resulting reference bits are subjected to an XOR operation as in 604 above. The result of the XOR operation is inverted and the final result is placed in page buffer 112. This final result is the data bit for the middle bit and is transferred to external buffer 106 for use by flash controller 104 as in 606 above. Note that instead of an XOR operation an XNOR operation can be used (as well as other operations permitting a similar result). In this case, the result of the XNOR operation is not inverted as it is the data bit.

A least-significant-bit ($2^0$ place) of 1 is associated with three data-bit regions. The first data-bit region associated with a least-significant bit of 1 is comprised of voltage thresholds within regions 702 and 704. The second data-bit region associated with a least-significant bit of 1 is comprised of voltage thresholds within regions 718-728. The third data-bit region associated with a least-significant bit of 1 is comprised of voltage thresholds within regions 742 and 744. A least-significant bit of 0 is associated with two data-bit regions. The first data-bit region associated with a least-significant bit of 0 is comprised of voltage thresholds within regions 706-716. The second data-bit region associated with a least-significant bit of 0 is comprised of voltage thresholds within regions 730-740.

To determine the least-significant bit of the data value stored in the cell, four reference voltages 752, 754, 756, and 758 (LSB Ref V 1-4) are applied as in 602 above. The resulting reference bits are subjected to XOR operations as in 604 above. The result of the XOR operation is inverted and the final result is placed in page buffer 112. This final result is the data bit for the least-significant bit and is transferred to external buffer 106 for use by flash controller 104 as in 606 above. Note that instead of XOR operations XNOR operations can be used. In this case, the result of the XNOR operations is not inverted as it is the data bit. Table II, below, illustrates the possible results of the above XOR, inversion, and XNOR operations.

TABLE II

| Reference bits from applying reference voltages 752, 754, 756, and 758 respectively | XOR | Inversion of XOR (e.g., the LSB) | XNOR (e.g., the LSB) |
| --- | --- | --- | --- |
| 1, 1, 1, 1 | 0 | 1 | 1 |
| 0, 1, 1, 1 | 1 | 0 | 0 |
| 0, 0, 1, 1 | 0 | 1 | 1 |
| 0, 0, 0, 1 | 1 | 0 | 0 |
| 0, 0, 0, 0 | 0 | 1 | 1 |

Figure 8:
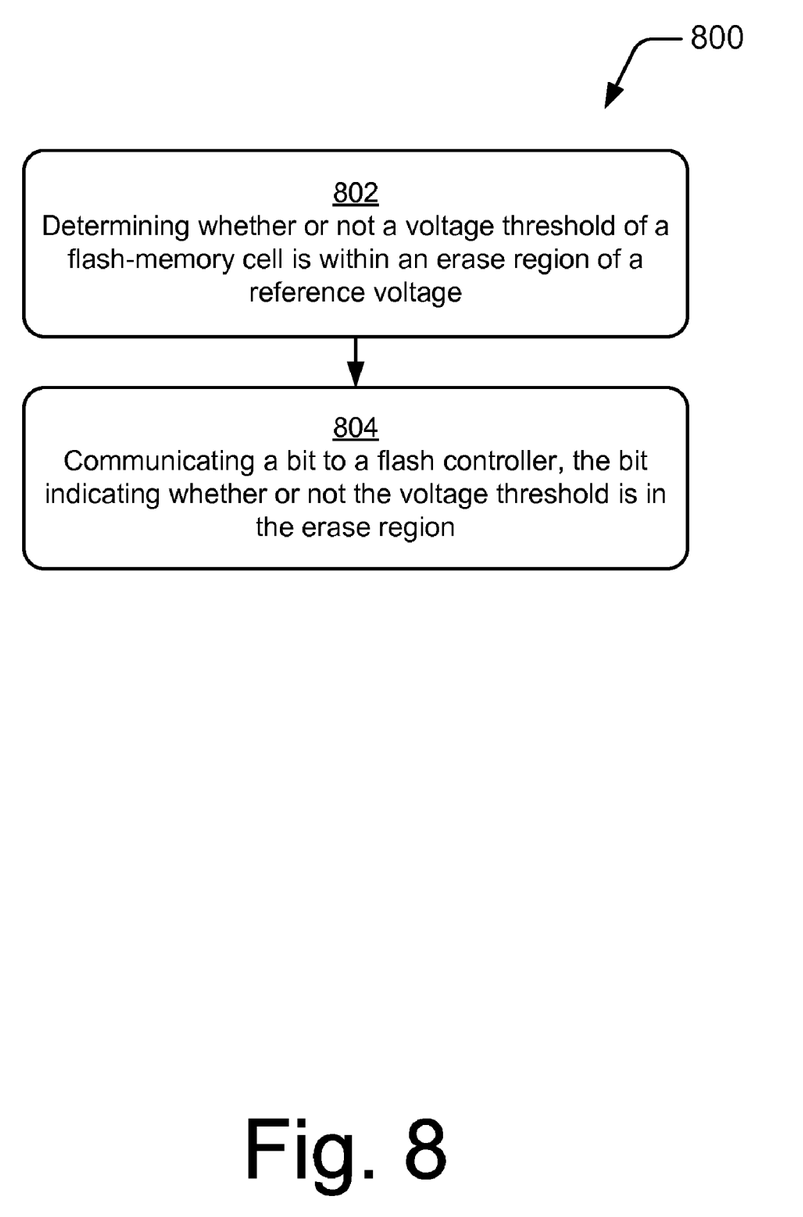
FIG. 8 illustrates a method, in accordance with an embodiment of the invention, to improve error correction of a cell.

FIG. 8 illustrates a method of improving error correction of a cell by detecting whether the voltage threshold is in close proximity to a border between two data-bit regions. At 802, it is determined whether or not a voltage threshold of a flash-memory cell is within an erase region of a reference voltage. This reference voltage, hereinafter the first reference voltage, has an erase region associated with it. The erase region is defined by a second reference voltage and a third reference voltage. The second reference voltage is lower than the first reference voltage and the third reference voltage is higher than the first reference voltage. The first reference voltage defines a border between two data-bit regions. At 804, a bit is communicated to a flash controller. The bit indicates whether or not the voltage threshold is in the erase region.

Using the example of FIG. 4, reference voltage 402 is applied and the resulting reference bit is stored. Reference voltage 404 is applied and the resulting reference bit is subjected to an XOR operation with the stored bit to produce a confidence bit. This confidence bit is transferred to flash controller 104 as at 804 above.

For a more detailed example consider FIG. 7. For the most-significant bit (MSB) of the data value stored in the cell, a single erase region surrounding reference voltage 746 is defined. This is identical to how the confidence bit is determined in FIG. 4. The confidence bit indicates whether or not the voltage threshold of the cell is within the erase region. If the voltage threshold is within the erase region, there is a much higher probability that the voltage threshold has floated between the first (702-722) and second (724-744) data-bit regions associated with a most-significant bit of 1 or 0 respectively.

For the middle bit, there are two reference voltages (748 and 750), each of which has an erase region. One erase region is comprised of voltage thresholds in regions 710 and 712. The other erase region is comprised of voltage thresholds in regions 734 and 736. To determine if the voltage threshold is within either erase region, four reference voltages are applied and the resulting reference bits are subjected to XOR operations. The result of the XOR operations is the confidence bit, which indicates if the voltage threshold is within either of the two erase regions. If the voltage threshold is within either erase region, there is a much higher probability that the voltage threshold has floated between the three data-bit regions associated with the middle bit. The confidence bit is transferred to flash controller 104 as at 804 above.

For the least-significant-bit (LSB), there are four reference voltages (752, 754, 756, and 758), each of which has an erase region. One erase region is comprised of voltage thresholds in regions 704 and 706, another erase region is comprised of voltage thresholds in regions 716 and 718, another erase region is comprised of voltage thresholds in regions 728 and 730, and another erase region is comprised of voltage thresholds in regions 740 and 742. To determine if the voltage threshold is within any of these erase regions, eight reference voltages are applied and the resulting reference bits are subjected to XOR operations. The result of the XOR operations is the confidence bit which indicates if the voltage threshold is within any of the erase regions. If the voltage threshold is within any of the erase regions, there is a much higher probability that the voltage threshold has floated between the five data-bit regions associated with the least-significant bit. The confidence bit is transferred to flash controller 104 as at 804 above. If finer resolution of reading is desired, more erase regions can be added by inserting additional reference voltages; however, the operation principle is similar to the above description. Soft error correction decoders can effectively exploit the output of multiple erase regions to improve the error decoding performance.

One or more of the techniques described above can be performed by one or more programmable processors executing a computer program to perform functions by operating on input data and generating output. Generally, the techniques can take the form of an entirely hardware embodiment, an entirely software embodiment, or an embodiment containing both hardware and software components. In one implementation, the methods are implemented in software, which includes but is not limited to firmware, resident software, microcode, etc. Furthermore, the methods can take the form of a computer program product accessible from a computer-usable or computer-readable medium providing program code for use by or in connection with a computer or any instruction execution system.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Although the subject matter has been described in language specific to structural features and/or methodological techniques and/or acts, it is to be understood that the subject matter defined in the appended claims is not necessarily limited to the specific features, techniques, or acts described above, including orders in which they are performed.

What is claimed is:

1. A method comprising:
   determining whether a voltage threshold of a flash-memory cell is or is not within an erase region of a first reference voltage, the erase region defined by a second reference voltage and a third reference voltage, the second reference voltage lower than the first reference voltage and the third reference voltage higher than the first reference voltage, the first reference voltage defining a border between two data bit regions, each data bit region associated with a data bit; and indicating to a flash controller, the indicator regards whether or not the voltage threshold is or is not in the erase region.

2. The method as recited in claim 1, wherein the indicator regards that the voltage threshold is in the erase region.

3. The method as recited in claim 1, wherein determining whether a voltage threshold of the flash-memory cell is within the erase region further comprises:

applying the second reference voltage to determine a first reference bit;

applying the third reference voltage to determine a second reference bit; and performing an exclusive-or (XOR) operation on the first and second reference bits to create the bit.

4. The method as recited in claim 1, wherein the flash memory cell is a single-level-cell (SLC) flash-memory cell.

5. The method as recited in claim 1, wherein the flash memory cell is a multi-level-cell (MLC) flash-memory cell.

6. The method as recited in claim 1, wherein the bit is a first bit, the erase region is a first erase region, and further comprising:

determining whether the voltage threshold is within a second erase region associated with a fourth reference voltage or a third erase region associated with a fifth reference voltage, the second erase region defined by a sixth reference voltage and a seventh reference voltage, the sixth reference voltage lower than the fourth reference voltage and the seventh reference voltage higher than the fourth reference voltage, the third erase region defined by an eighth reference voltage and a ninth reference voltage, the eighth reference voltage lower than the fifth reference voltage and the ninth reference voltage higher than the fifth reference voltage, the fourth reference voltage lower than the fifth reference voltage, the fourth and fifth reference voltages defining respective borders between three data bit regions, each data bit region associated with a data bit; and communicating a second bit to the flash controller, the second bit indicating whether or not the voltage threshold is in either of the second or third erase regions.

7. The method as recited in claim 6, further comprising correcting an error using the first bit and the second bit.

8. A cell reader implemented at least partially in hardware, the cell reader configured to:

determine whether a voltage threshold of a flash-memory cell is or is not within an erase region of a first reference voltage, the erase region defined by a second reference voltage and a third reference voltage, the second reference voltage lower than the first reference voltage and the third reference voltage higher than the first reference voltage, the first reference voltage defining a border between two data bit regions, each data bit region associated with a data bit; and indicate, to a flash controller, whether or not the voltage threshold is or is not in the erase region.

9. The cell reader as recited in claim 8, wherein the indicator regards that the voltage threshold is in the erase region.

10. The cell reader as recited in claim 8, wherein determine whether a voltage threshold of the flash-memory cell is within the erase region further comprises:

apply the second reference voltage to determine a first reference bit;

apply the third reference voltage to determine a second reference bit; and perform an exclusive-or (XOR) operation on the first and second reference bits to create the bit.

11. The cell reader as recited in claim 8, wherein the flash memory cell is a single-level-cell (SLC) flash-memory cell.

12. The cell reader as recited in claim 8, wherein the flash memory cell is a multi-level-cell (MLC) flash-memory cell.

13. The cell reader as recited in claim 8, wherein the bit is a first bit, the erase region is a first erase region, and further configured to:

determine whether the voltage threshold is within a second erase region associated with a fourth reference voltage or a third erase region associated with a fifth reference voltage, the second erase region defined by a sixth reference voltage and a seventh reference voltage, the sixth reference voltage lower than the fourth reference voltage and the seventh reference voltage higher than the fourth reference voltage, the third erase region defined by an eighth reference voltage and a ninth reference voltage, the eighth reference voltage lower than the fifth reference voltage and the ninth reference voltage higher than the fifth reference voltage, the fourth reference voltage lower than the fifth reference voltage, the fourth and fifth reference voltages defining respective borders between three data bit regions, each data bit region associated with a data bit; and communicate a second bit, to the flash controller, indicating whether or not the voltage threshold is in either of the second or third erase regions.

14. The cell reader as recited in claim 13, further configured to correct an error using the first bit and the second bit.

15. A flash memory device comprising:

a flash controller;

a flash-memory cell; and a cell reader configured to:

determine whether a voltage threshold of the flash-memory cell is or is not within an erase region of a first reference voltage, the erase region defined by a second reference voltage and a third reference voltage, the second reference voltage lower than the first reference voltage and the third reference voltage higher than the first reference voltage, the first reference voltage defining a border between two data bit regions, each data bit region associated with a data bit; and indicate, to the flash controller, whether or not the voltage threshold is or is not in the erase region.

16. The flash memory device as recited in claim 15, wherein the indicator regards that the voltage threshold is in the erase region.

17. The flash memory device as recited in claim 15, wherein the configuration of determine whether a voltage threshold of the flash-memory cell is within the erase region is further configured to:

apply the second reference voltage to determine a first reference bit;

apply the third reference voltage to determine a second reference bit; and perform an exclusive-or (XOR) operation on the first and second reference bits to create the bit.

18. The flash memory device as recited in claim 15, wherein the flash memory cell is a single-level-cell (SLC) flash-memory cell.

19. The flash memory device as recited in claim 15, wherein the flash memory cell is a multi-level-cell (MLC) flash-memory cell.

20. The flash memory device as recited in claim 15, wherein the bit is a first bit, the erase region is a first erase region, and the cell reader is further configured to:

determine whether the voltage threshold is within a second erase region associated with a fourth reference voltage or a third erase region associated with a fifth reference voltage, the second erase region defined by a sixth reference voltage and a seventh reference voltage, the sixth reference voltage lower than the fourth reference voltage and the seventh reference voltage higher than the fourth reference voltage, the third erase region defined by an eighth reference voltage and a ninth reference voltage, the eighth reference voltage lower than the fifth reference voltage and the ninth reference voltage higher than the fifth reference voltage, the fourth reference voltage lower than the fifth reference voltage, the fourth and fifth reference voltages defining respective borders between three data bit regions, each data bit region associated with a data bit; and communicate a second bit, to the flash controller, indicating whether or not the voltage threshold is in either of the second or third erase regions.

21. The flash memory device as recited in claim 20, further configured to correct an error using the first bit and the second bit.

* * * * *